United States Patent [19]

Pritikin

[11] 4,447,519
[45] May 8, 1984

[54] SOLID PHOTORESIST AND METHOD OF MAKING PHOTORESIST

[76] Inventor: Nathan Pritikin, 26 Coromar Dr., Goleta, Calif. 93017

[21] Appl. No.: 509,589

[22] Filed: Jun. 29, 1983

Related U.S. Application Data

[63] Continuation of Ser. No. 331,209, Dec. 16, 1981, abandoned, which is a continuation of Ser. No. 152,623, May 23, 1980, abandoned, which is a continuation of Ser. No. 570,751, Apr. 23, 1975, abandoned.

[51] Int. Cl.³ .............................................. G03C 1/76
[52] U.S. Cl. .................................. 430/275; 430/274; 430/312; 430/313; 430/496; 156/629; 156/630; 156/901; 427/97; 428/459; 428/460; 428/461; 428/463; 428/901
[58] Field of Search ............... 430/275, 313, 319, 496, 430/935, 524, 525; 156/629, 630, 654, 901, 902; 428/459, 460, 463, 461, 901; 427/96, 97

[56] References Cited

U.S. PATENT DOCUMENTS

| | | | |
|---|---|---|---|
| 2,819,164 | 1/1958 | Boeasma | 430/325 |
| 2,943,936 | 7/1960 | Spechler | 430/271 |
| 3,102,030 | 8/1963 | Hoerner | 430/274 |
| 3,167,463 | 1/1963 | Patsko | 156/659.1 |
| 3,240,624 | 3/1966 | Beck | 427/96 |
| 3,469,982 | 9/1969 | Celeste | 430/280 |
| 3,532,052 | 10/1970 | Erickson | 430/308 |
| 3,677,755 | 7/1972 | Fuki et al. | 430/281 |
| 3,758,306 | 9/1973 | Roos | 430/272 |
| 3,767,398 | 10/1973 | Morgan | 430/275 |
| 3,773,514 | 11/1973 | Fromson | 430/311 |
| 3,787,212 | 1/1974 | Heimsch et al. | 430/281 |
| 4,018,940 | 4/1977 | Morgan | 430/315 |

Primary Examiner—J. Travis Brown
Attorney, Agent, or Firm—Harris, Kern, Wallen & Tinsley

[57] ABSTRACT

A process for making printed circuit boards and the like including laminating a layer of a solid nonsensitized photoresist material onto a substrate producing a product suitable for indefinite storage under any light condition. A process including the further steps of sensitizing the solid photoresist material by wetting with a liquid sensitizer, drying the sensitized photoresist material, and then following the conventional exposure, developing and etching steps.

21 Claims, 3 Drawing Figures

SOLID PHOTORESIST AND METHOD OF MAKING PHOTORESIST

This application is a continuation of application Ser. No. 331,209, filed Dec. 16, 1981, now abandoned, which was a continuation of application Ser. No. 152,623, filed May 23, 1980, now abandoned, which was a continuation of application Ser. No. 570,751, filed Apr. 23, 1975, now abandoned.

BACKGROUND OF THE INVENTION

This invention relates to photoresists suitable for the manufacture of printed circuit boards and the like, and more specifically solid photoresists as contrasted to liquid photoresists.

Photoresists are light sensitive materials that can be coated or bonded to substrates, and can be differentially removed in the form of a predetermined pattern. The remaining material may act as a resistant material to chemical or physical action applied to the substrate. Liquid photosensitive resists have been used since the 19th century for printing plates and for printed circuits since their inception in the 1940s.

Liquid photoresists are applied by dipping, rolling, whirling and other methods which have several disadvantages. Some of these include drying times and clogging of holes in printed circuit boards.

In recent years presensitized solid resists in the form of a laminated 3 layer film have become popular. The photoresists is quite fragile and requires a plastic sheet on each side of the resist film for protection. A process for preparing such a photoresist is described in U.S. Pat. No. 3,469,982.

During use, one outer layer is removed as the film is laminated under elevated temperature to a substrate. In printed circuits, the substrate would be the copper surface of a copper clad insulating laminate. The other outer plastic layer of a clear plastic remains on the photoresist layer during the exposure to prevent the photostencil from adhering to the photoresist and also possibly damaging it.

The clear plastic layer prevents the photostencil from intimate contact with the photoresist. Any separation degrades the sharpness of the image in contact resist printing, so that the clear plastic layer degrades the image quality in proportion to its thickness.

A problem with such a presensitized film is that it can be used only in a subdued light area. Another disadvantage is the limited storage life of the presensitized materials. Yet another is the high cost of producing such a specialized resist.

In spite of the shortcomings of the solid presensitized resists, they have several advantages over the liquid resists, and are rapidly gaining in usage.

It is an object of the present invention to provide a new and improved photoresist and process for making solid photoresists. Other objects, advantages, features and results will more fully appear from the following description.

SUMMARY OF THE INVENTION

The process of this invention for adhering a resist pattern to the surface of a metal, plastic, inorganic nonconductor or other material includes: adhering to a substrate, a nonsensitized film which is capable of being sensitized; sensitizing the film; exposing the film; developing the film; and increasing the chemical and physical resistance of the film, i.e., fixing the developed film.

The substrate can now be etched, plated, sandblasted, or treated in whatever manner desired. After the treatment, the resist may be stripped from the substrate in whatever agent that is suitable for its removal. The invention also includes the multilayer structure of nonsensitized film and substrate suitable for storage and/or sensitizing.

DESCRIPTION OF THE PREFERRED EMBODIMENTS

Figure 1:
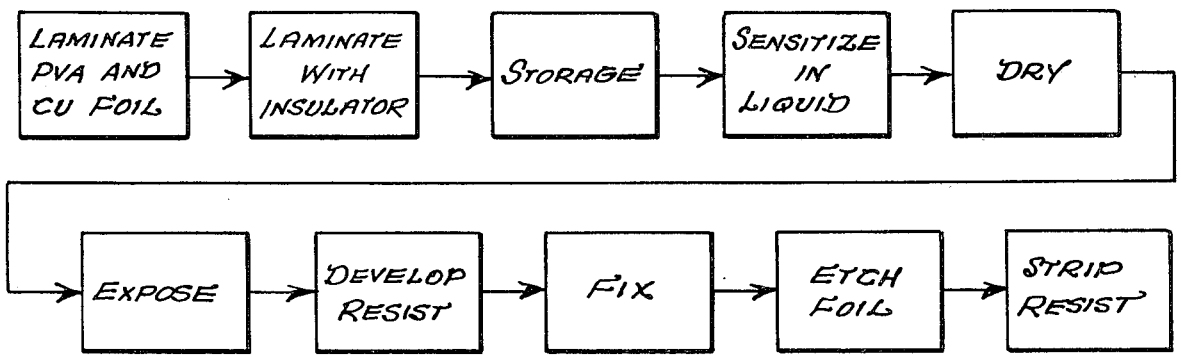
FIG. 1 is a flow chart showing the steps of a process of making photoresist incorporating the presently preferred embodiment of the invention.
Figure 2:
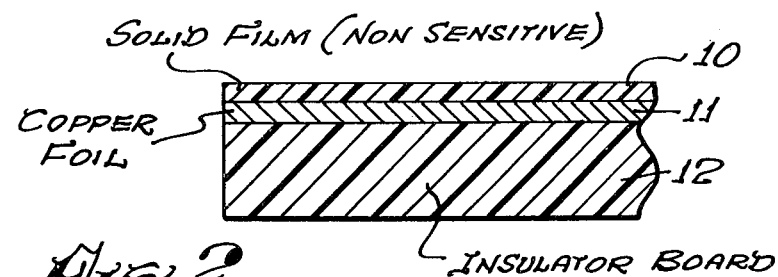
FIG. 2 is a sectional view of a laminated structure suitable for use in a printed circuit board and incorporating the presently preferred embodiment of the invention.

A nonsensitized layer, such as a film of polyvinyl alcohol 10 is laminated to a substrate such as a layer of copper foil 11. This sandwich of plastic film and metal foil may be laminated to another support, such as an insulator board 12. In an alternative sequence, the metal foil may be laminated to the insulator board, after which the nonsensitized layer may be laminated to the foil. Of course, the invention is not limited to the use of a metal foil and insulator board, and the nonsensitized film may be laminated to any suitable substrate.

This sandwich structure may be handled in any light conditions, may be stored indefinitely, and is ready for use at any time.

In the next step, the plastic layer is sensitized by wetting with a sensitizing liquid, as by dipping or spraying or the like. The remaining steps of the process may be conventional. The now sensitized solid film is dried, exposed through a negative, normally by contact printing, and developed. In some processes, the sensitized material is hardened where exposed to the light and the unexposed material is removed in the developing process. In other processes, the exposed material is removed in the developing process. The remaining resist usually is treated to improve its chemical and/or physical resistance, and this step is usually referred to as fixing. Next the board is etched to remove the metal not protected by the resist, after which the resist is removed, leaving the metal in the desired pattern on the insulator board.

The invention will be further illustrated in and by the following examples which are not intended to limit the invention except as set forth in the claims.

EXAMPLE 1

A 0.0015 inch thick film of polyvinyl alcohol (PVA) was laminated at room temperature to a water moistened copper clad printed circuit board. The lamination was done with rubber-covered rollers with a pressure of 3 pounds per linear inch at the nip at a rate of 1 inch per second.

The PVA film was 88% hydrolyzed, with a molecular weight of 96,000 and a residual polyvinyl acetate content of approximately 21%. The copper clad laminate was prepared by cleaning with commercial abrasive cleaners, such as pumice, rinsed in water and dried.

Sensitizing the film can take place immediately or at any time into the future. The nonsensitized film is sensitized by dipping into a 1% ammonium dichromate water solution for 10 seconds and drying at room temperature. The dipping time is not critical, and the dichromate can be sprayed or rolled or applied in any other way to the film.

After the film is dry, it may be exposed. The laminate was placed in a printing frame and exposed before a 35 amp lamp for 30 seconds at a distance of 24 inches.

It was then developed by immersing in room temperature water with some agitation for 10 minutes. Alternately, development can be achieved by spraying water on the film for 3 minutes. The film is then dried, by forced air, and baked at 300° F. for 30 lminutes to physically harden the film.

If it is desired to make the film more chemical resistant, after development, it can be dipped in various hardening solutions, such as chromic acid, sodium molybdate, or ferric nitrate. After the dipping, it then would undergo the baking step.

The resisted substrate is now ready for standard plating or etching procedures. After the processing is completed, the resist can be stripped in a hot alkali solution.

Other resin systems for the nonsensitized photoresist film can be used as long as they can be sensitized after the film is adhered to the substrate.

As an alternative to laminating with pressure rollers, the layer of solid nonsensitized photoresist material can be cast or extruded as a film directly onto the substrate.

EXAMPLE 2

A 0.003 inch thick gelatin film was laminated as in Example 1. Raw material for the film came from conventional animal sources. Although fish gelatin can be used, it would be more expensive. The copper clad was cleaned as in Example 1. After laminating, the gelatin film was sensitized in a 2% potassium dichromate water solution and dried at room temperature.

After drying for 30 Minutes, the film was exposed in a vacuum printing frame for 60 seconds before a 35 amp arc light at a distance of 30 inches. Development was accomplished by placing the laminate in an agitated water bath at room temperature (62° to 80° F.) for six minutes. After the excess moisture was removed by room temperature forced air, the part was baked at 300° F. for 30 minutes. After plating or etching, the resist was stripped in a 20% sodium hydroxide water solution at 160° F.

EXAMPLE 3

Mixtures of resins can be used. A 0.0015 inch thick film cast from a solution of 50% of the polyvinyl alcohol used in Example 1, and 50% of a polyvinyl acetate/ethylene copolymer (DuPone Elvace 1875) was used in this example. A mixture of PVA and polyvinyl acetate is equally satisfactory and can be substituted for the polyvinyl acetate/ethylene copolymer.

Figure 3:
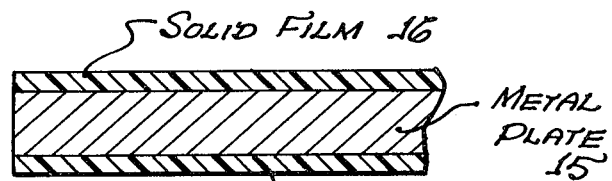
FIG. 3 is a view similar to FIG. 2 showing an alternative embodiment of the invention.

A sheet of Alloy 42 (15 in FIG. 3) 0.010 inch thick is cleaned by pumice and water on both sides and dried. The sheet is laminated with the films 16, 17 on both sides at once under the same conditions as Example 1.

Immediately after laminating, the sheet was dipped for 3 seconds in a solution of 0.8% ammonium dichromate and dried for 30 minutes at room temperature. Next it was exposed on both sides for 30 seconds at 20 inches from a set of 35 amp arc lamps.

Development was accomplished by spraying on 95° F. water for 4 minutes, followed by dipping in chromic acid 1 oz. per gallon for 10 seconds, after which it was blown dry.

After baking the part for 30 minutes at 300° F., it was ready for etching. After a preliminary cleaning with pumice and water, the part was etched in ferric chloride, 42° Baume, for 6 minutes.

EXAMPLE 4

A 0.0015 inch thick film was cast from a polyvinyl butyral resin. The resin had the following properties:
Molecular weight: 65000
Hydroxyl content: 19%
Acetate content: 2.5% maximum Using the same laminating conditions as Example 1, except that the rollers were heated to 370° F., a dry and clean copper clad board was laminated. The laminated board was then sensitized by dipping for 10 seconds in the following solution.
$C_2H_5OC_2H_4OH$:—100 parts by volume
30% water solution of—1½ parts by volume ammonium dichromate After drying for 30 minutes, the part was exposed in a vacuum frame for 20 seconds 24 inches from a 35 amp arc light. The board was developed in methyl alcohol at room temperature for 7 minutes, and then baked for 20 minutes at 250° F.

EXAMPLE 5

A 0.003 inch thick shellac film was processed using the same conditions as in Example 4, except that it was laminated at room temperature using ethyl alcohol to dampen the film immediately before laminating.

Thus it can be noted that many films, both water and organic solvent soluble that are capable of being sensitized to light, can be used. In every case, the films are laminated in daylight and can be stored indefinitely. The choice is dictated by severity of application and cost of the film and developer. Sensitizers such as diazo compounds or any other chemical that will sensitize a solid film resist can be used. Various dyes or pigments can be added into the resin before the film is made to increase the contrast of the developed pattern.

If the thickness of the photoresist film is desired to be less than is possible because of the physical limitation of the film, the photoresist material can be coated onto a self-supporting plastic film. After lamination, the carrier film may be peeled from the thin film which now can be sensitized and go through the processing steps.

The present invention provides several advantages over prior presensitized solid resists.

1. A nonsensitized film can be adhered to a substrate in daylight with no restrictions as to a high level of illumination.

2. A nonsensitized film has indefinite storage life.

3. After adhering to a substrate, the substrate surface is protected by the film, and the combination can be stored indefinitely without adverse effects from time or temperature or light.

4. Cost of suitable films are a fraction of presensitized films.

5. A protective layer is unnecessary on either side of the film.

6. Films can be selected that have high physical properties, such as tensile strength and abrasion resistance, so that the film can indefinitely protect the substrate surface from oxidation, scratches, etc.

7. Films can be selected that will develop in water rather than the expensive chemical and solvent systems in the other solid presensitized resists. Water development becomes more important as sewer disposal problems increase.

8. Nonsensitized films can be coated or laminated onto thin copper foil in continuous rolls. These are then laminated to nonconductive plastic laminates. This eliminates any cleaning on the copper foil before laminating and prevents oxidation during lamination. This alone would be a valuable savings for the laminator.

9. The user would receive the substrate already covered with a resist which protects the surface of the metal foil and which saves the operation of resist lamination. Since some printed circuit laminations are 48 inches wide and as long as 72 inches, resist coated substrates beyond the capacity of any resist laminator commercially available would be available to the user.

I claim:

1. A photoresist process in the production of a printed circuit board including the steps of:
   attaching a metal foil onto an insulator board to form a substrate;
   producing holes through the foil and board of the substrate;
   laminating a continuous homogenous and self-supporting single layer thin film of a solid nonsensitized material which is capable of being sensitized to a photoresist, onto the foil side of the substrate covering the holes without introducing the material into the holes;
   after laminating the material and substrate, sensitizing the material by wetting with a liquid sensitizer; and
   drying the sensitized photoresist material.

2. A photoresist process in the production of a printed circuit board including the steps of:
   attaching a metal foil onto an insulator board to form a substrate;
   laminating a continuous homogenous and self-supporting single layer thin film of a solid nonsensitized material which is capable of being sensitized to a photoresist, onto the foil side of the substrate as the sole photoresist material on the foil;
   after laminating the solid nonsensitized material and substrate, sensitizing the material by wetting with a liquid sensitizer; and
   drying the sensitized photoresist material.

3. A photoresist process in the production of a printed circuit board including the steps of:
   attaching a metal foil onto an insulator board to form a substrate;
   producing holes through the foil and board of the substrate; and
   laminating a continuous homogenous and self-supporting single layer thin film of a solid nonsensitized material which is capable of being sensitized to a photoresist, onto the foil side of the substrate covering the holes without introducing the material into the holes,
   said solid nonsensitized material being polyvinyl alcohol film.

4. A photoresist process in the production of a printed circuit board including the steps of:
   attaching a metal foil onto an insulator board to form a substrate;
   producing holes through the foil and board of the substrate; and
   laminating a continuous homogenous and self-supporting single layer thin film of a solid nonsensitized material which is capable of being sensitized to a photoresist, onto the foil side of the substrate covering the holes without introducing the material into the holes,
   said solid nonsensitized material being a gelatin film.

5. A photoresist process in the production of a printed circuit board including the steps of:
   attaching a metal foil onto an insulator board to form a substrate;
   producing holes through the foil and board of the substrate;
   laminating a continuous homogenous and self-supporting single layer thin film of a solid nonsensitized material which is capable of being sensitized to a photoresist, onto the foil side of the substrate covering the holes without introducing the material into the holes, and
   sensitizing the solid nonsensitized material by wetting with a potassium dichromate water solution.

6. A photoresist process in the production of a printed circuit board including the steps of:
   attaching a metal foil onto an insulator board to form a substrate;
   producing holes through the foil and board of the substrate; and
   laminating a continuous homogenous and self-supporting single layer thin film of a solid nonsensitized material onto the foil side of the substrate covering the holes without introducing the material into the holes,
   said solid nonsensitized material being a mixture of polyvinyl alcohol and polyvinyl acetate.

7. A photoresist process in the production of a printed circuit board including the steps of:
   attaching a metal foil onto an insulator board to form a substrate;
   producing holes through the foil and board of the substrate; and
   laminating a continuous homogenous and self-supporting single layer thin film of a solid nonsensitized material onto the foil side of the substrate covering the holes without introducing the material into the holes,
   said solid nonsensitized material being a polyvinyl butyral film.

8. A photoresist process in the production of a printed circuit board including the steps of:
   attaching a metal foil onto an insulator board to form a substrate;
   producing holes through the foil and board of the substrate;
   laminating a continuous homogenous and self-supporting single layer thin film of a solid nonsensitized material which is capable of being sensitized to a photoresist, onto the foil side of the substrate covering the holes without introducing the material into the holes, and
   sensitizing the material by wetting with a solution of $C_2H_5OC_2H_2OH$ and an ammonium dichromate water solution.

9. A photoresist process in the production of a printed circuit board including the steps of:
   attaching a metal foil onto an insulator board to form a substrate;
   producing holes through the foil and board of the substrate; and laminating a continuous homogenous and self-supporting single layer thin film of a solid nonsensitized material which is capable of being sensitized to a photoresist, onto the foil side of the substrate covering the holes without introducing the material into the holes, said solid nonsensitized material being a mixture of polyvinyl alcohol and polyvinyl acetate/ethylene copolymer.

10. A process as defined in claim 1 including the steps of:
exposing the sensitized photoresist material to a pattern of radiation; and
then developing the sensitized photoresist material to leave a pattern of photoresist material on the substrate.

11. A process as defined in claim 10 including the steps of:
treating the substrate not covered by the photoresist material; and
then removing the remaining photoresist material.

12. A process as defined in claim 9 including the steps of:
after applying the solid nonsensitized material, sensitizing the material by wetting with a liquid sensitizer; and
drying the sensitized material.

13. A process as defined in claim 9 including laminating the solid nonsensitized material and substrate by wetting at least one of the material and substrate and then passing the layer of material and substrate between pressure rollers.

14. A process as defined in claim 9 including laminating another layer of solid nonsensitized material onto the other side of the substrate.

15. A process as defined in claim 3 including sensitizing the solid nonsensitized material by wetting with an ammonium dichromate water solution.

16. A photoresist product for a printed circuit board, including in combination:
an insulator board with a flat surface;
a metal foil on said flat surface of said board forming a printed circuit board substrate;
said board and foil of said substrate having a plurality of holes therethrough; and
a single self supporting continuous homogenous layer in a thin film of a solid nonsensitized material which is capable of being sensitized to a photoresist, laminated on the foil side of said substrate as the sole photoresist material on said foil, with no additional layer or layers of photoresist material on said continuous film;
said continuous film covering said holes without introducing material into said holes, and said nonsensitized material being a polyvinyl alcohol film.

17. The product of claim 16 including a second layer of said solid nonsensitized material laminated on the other side of said substrate.

18. A photoresist product for a printed circuit board, including in combination:
an insulator board with a flat surface;
a metal foil on said flat surface of said board forming a printed circuit board substrate;
said board and foil of said substrate having a plurality of holes therethrough; and
a single self supporting continuous homogenous layer in a thin film of a solid nonsensitized material which is capable of being sensitized to a photoresist, laminated on the foil side of said substrate for use in forming a protective pattern on the substrate as the sole photoresist material on said foil, with no additional layer or layers of photoresist material on said continuous film;
said continuous film covering said holes without introducing material into said holes, and said solid nonsensitized material being a gelatin film.

19. A photoresist product for a printed circuit board, including in combination:
an insulator board with a flat surface;
a metal foil on said flat surface of said board forming a printed circuit board substrate;
said board and foil of said substrate having a plurality of holes therethrough; and
a single self supporting continuous homogenous layer in a thin film of a solid nonsensitized material which is capable of being sensitized to a photoresist, laminated on the foil side of said substrate for use in forming a protective pattern on the substrate as the sole photoresist material on said foil, with no additional layer or layers of photoresist material on said continuous film;
said continuous film covering said holes without introducing material into said holes, and said solid nonsensitized material being a mixture of polyvinyl alcohol and polyvinyl acetate/ethylene copolymer.

20. A photoresist product for a printed circuit board, including in combination:
an insulator board with a flat surface;
a metal foil on said flat surface of said board forming a printed circuit board substrate;
said board and foil of said substrate having a plurality of holes therethrough; and
a single self supporting continuous homogenous layer in a thin film of a solid nonsensitized material which is capable of being sensitized to a photoresist, laminated on the foil side of said substrate for use in forming a protective pattern on the substrate as the sole photoresist material on said foil, with no additional layer or layers of photoresist material on said continuous film;
said continuous film covering said holes without introducing material into said holes, and said solid nonsensitized material being a mixture of polyvinyl alcohol and polyvinyl acetate.

21. A photoresist product for a printed circuit board, including in combination:
an insulator board with a flat surface;
a metal foil on said flat surface of said board forming a printed circuit board substrate;
said board and foil of said substrate having a plurality of holes therethrough; and
a single self supporting continuous homogenous layer in a thin film of a solid nonsensitized material which is capable of being sensitized to a photoresist, laminated on the foil side of said substrate for use in forming a protective pattern on the substrate as the sole photoresist material on said foil, with no additional layer or layers of photoresist material on said continuous film;
said continuous film covering said holes without introducing material into said holes, and said solid nonsensitized material being a polyvinyl butyral film.

* * * * *